US006716039B1

(12) United States Patent
Peloza et al.

(10) Patent No.: US 6,716,039 B1
(45) Date of Patent: Apr. 6, 2004

(54) BOARD MOUNTED ELECTRICAL CONNECTOR

(75) Inventors: Kirk B. Peloza, Naperville, IL (US); Kent Regnier, Lombard, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/272,965

(22) Filed: Oct. 17, 2002

(51) Int. Cl.$^{7}$ .......................... H01R 12/00; H05K 1/00
(52) U.S. Cl. .......................................... 439/83; 439/637
(58) Field of Search ........................... 439/83, 566, 637

(56) References Cited

U.S. PATENT DOCUMENTS

| | | | | |
|---|---|---|---|---|
| 4,653,682 A | * 3/1987 | Dines et al. | ........... | 228/180.21 |
| 4,771,159 A | 9/1988 | O'Leary | ...................... | 219/85 |
| 5,152,451 A | 10/1992 | Darveaux et al. | ......... | 228/180.2 |
| 5,626,483 A | 5/1997 | Naitoh | ......................... | 439/74 |
| 5,735,696 A | 4/1998 | Niitsu et al. | .................. | 439/65 |
| 6,179,648 B1 | 1/2001 | Ng et al. | ..................... | 439/496 |
| 6,315,605 B1 | 11/2001 | Billman et al. | .......... | 439/540.1 |
| 2002/0092162 A1 | * 7/2002 | Tsai et al. | ...................... | 29/840 |

* cited by examiner

*Primary Examiner*—Hae Moon Hyeon
(74) *Attorney, Agent, or Firm*—Stephen Z. Weiss

(57) ABSTRACT

A board mounted electrical connector includes a dielectric housing for mounting on a printed circuit board. An elongated solder bar of solderable material is secured at a bottom face of the housing for mechanically fixing the housing to appropriate solder pad on the board. The elongated solder bar has opposite ends and air vent openings spaced between the opposite ends to facilitate air flow during a soldering process.

29 Claims, 6 Drawing Sheets

BOARD MOUNTED ELECTRICAL CONNECTOR

FIELD OF THE INVENTION

This invention generally relates to the art of electrical connectors and, particularly, to an improved means for securing or fixing an electrical connector to a printed circuit board.

BACKGROUND OF THE INVENTION

A typical electrical connector includes some form of dielectric housing which mounts a plurality of conductive terminals. The electrical connector may be mounted on a printed circuit board, and the terminals may have tail portions for surface connection, as by soldering, to circuit traces on the board or for insertion into holes in the board for connection, as by soldering, to circuit traces on the board and/or in the holes. Problems continue to be encountered with circuit board mounted electrical connectors caused by damaging forces placed on solder joints between the terminal solder tail and the respective circuit trace on the board.

In order to prevent solder joint damage, various means have been used to mechanically secure or fix the connector housing to the printed circuit board. Such means include fasteners, solderable fitting nails fixed to the dielectric housing, a plated surface on the dielectric housing or a metal housing which, itself, is soldered to a pad on the circuit board. Unfortunately, with the ever-increasing miniaturization of electrical connectors, fasteners are difficult to apply. Fasteners do not work well with smaller connectors, and they require inventory storage and shipment of separate components. Solderable fitting nails typically are inserted into slots in the sides of the connector housing and do not provide support at the middle of the housing between the sides. Plating the connector housing with solderable material can be effective, but such plating processes are quite expensive in comparison to the overall cost of the connector and is not even cost effective for most applications. A metal connector housing may be effectively soldered to pads on the printed circuit board, but metal housings are unduly heavy in comparison to plastic housings and it is difficult to solder beneath the housing which effectively acts as a thermal heat sink. The present invention is directed to solving these problems by providing a board mounted electrical connector with an improved means for securing or fixing the connector to a printed circuit board.

SUMMARY OF THE INVENTION

An object, therefore, of the invention is to provide a new and improved board mounted electrical connector.

In the exemplary embodiment of the invention, the connector includes a dielectric housing having a bottom face for mounting on a printed circuit board. An elongated solder bar of solderable material is secured to the bottom face of the housing for mechanically fixing the housing to an appropriate solder pad on the board. The elongated solder bar has opposite ends and is provided with air vent openings spaced between the opposite ends to facilitate air flow during a soldering process.

Preferably, the dielectric housing includes cut-out areas behind the solder bar in registry with the air vent openings. This improves the air flow in the area of the vent openings.

According to one aspect of the invention, the housing has an elongated rib. The elongated solder bar is U-shaped in cross-section and embraces the rib. The U-shaped solder bar defines a pair of side wall portions joined by a base wall portion. The vent openings are located at least in the base wall portion. In the exemplary embodiment, the vent openings extend into the side wall portions of the U-shaped solder bar. The rib has cut-out areas in registry with the vent openings.

According to another aspect of the invention, the dielectric housing is molded of plastic material and is overmolded over portions of the solder bar to secure the bar to the housing. Preferably, the solder bar includes a plurality of holes into which the molded material of the housing projects.

According to a further aspect of the invention, the dielectric housing includes an elongated air vent channel adjacent to and extending along substantially the length of the elongated solder bar. This elongated air vent channel preferably is wider at a central area thereof than at opposite end areas thereof.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
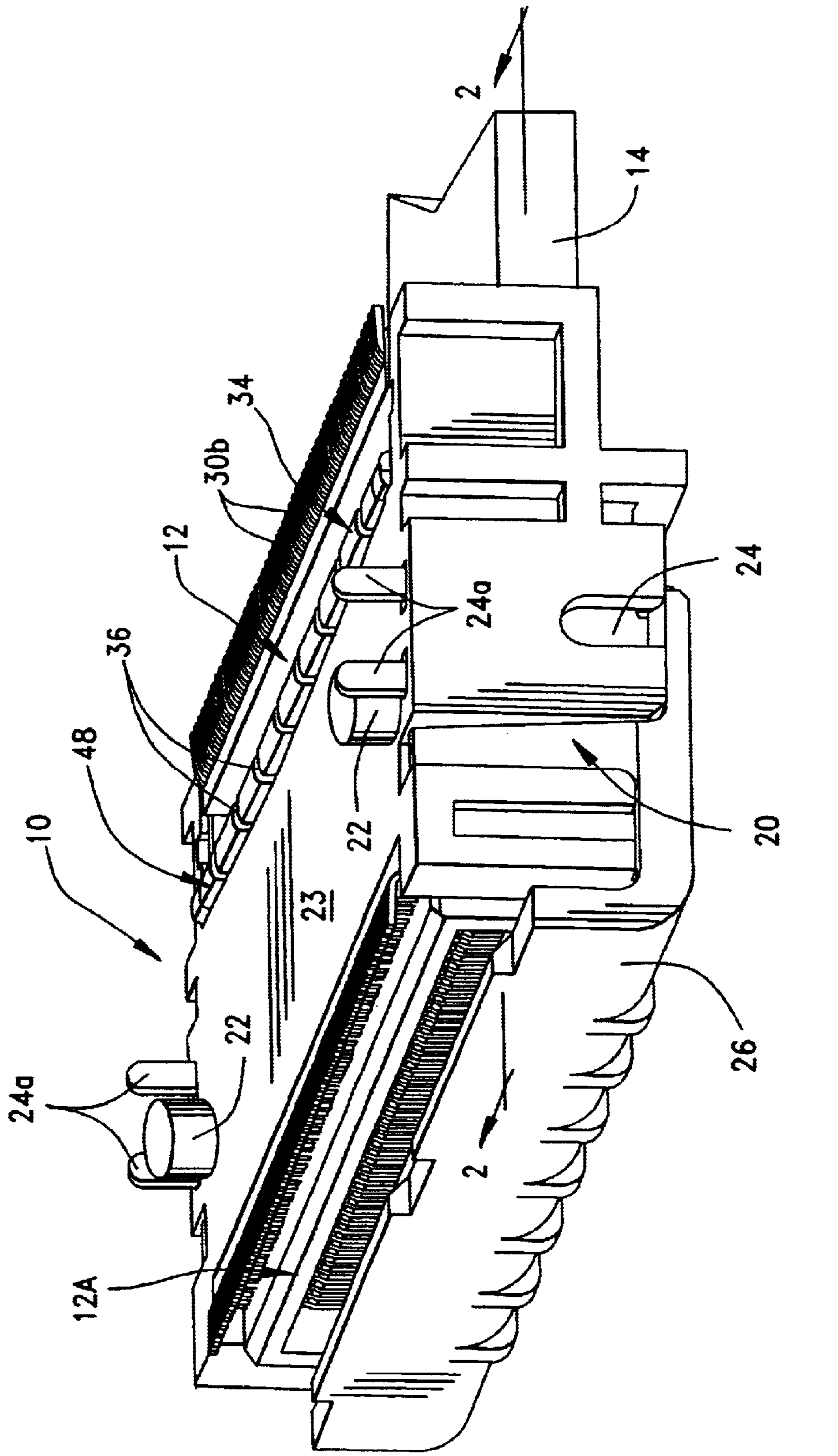
FIG. 1 is a perspective view looking at the bottom of an electrical connector assembly incorporating the elongated solder bar of the invention.
Figure 2:
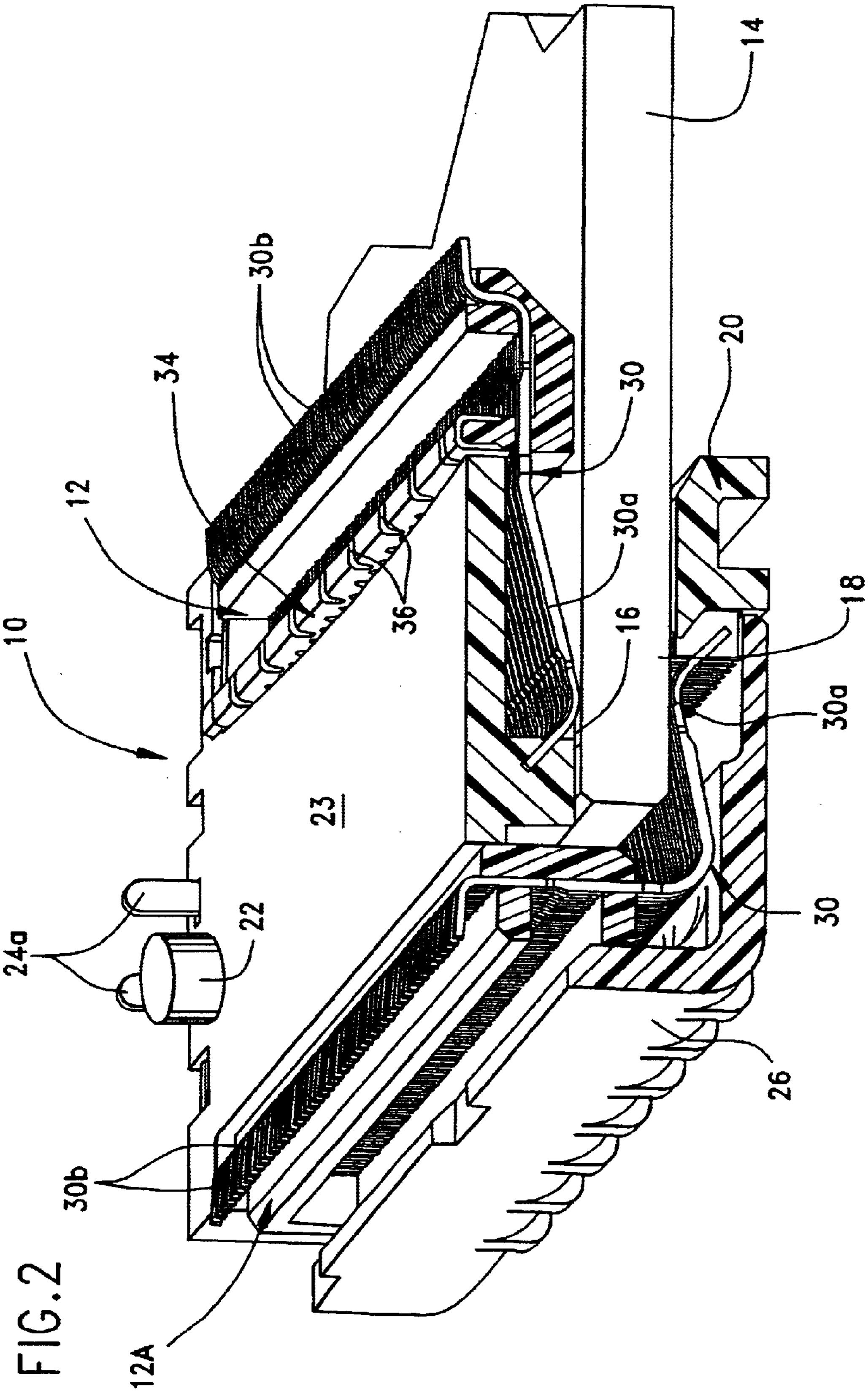
FIG. 2 is a vertical section taken generally along line 2—2 of FIG. 1.
Figure 3:
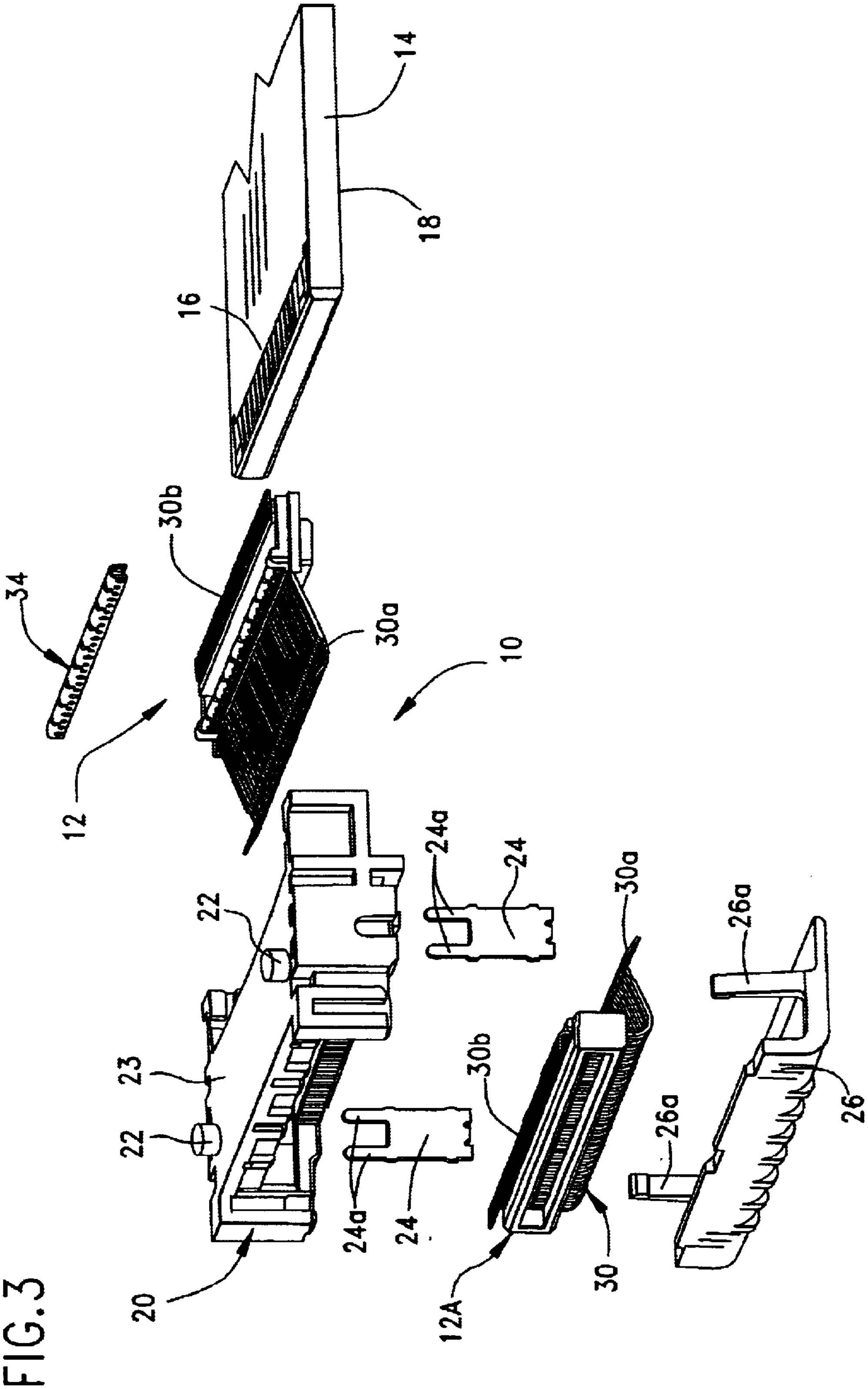
FIG. 3 is an exploded perspective view of the connector assembly of FIG. 1.

Referring to the drawings in greater detail, and first to FIGS. 1–3, the invention is embodied in a circuit board mountable electrical connector assembly, generally designated 10, which incorporates a pair of terminal modules, generally designated 12 and 12A. The connector assembly is designed for receiving a circuit board 14 having contacts 16 on one side thereof and contacts 18 on an opposite side thereof. As will be seen hereinafter, contacts 16 and 18 on opposite sides of the circuit board engage terminals of terminal modules 12 and 12A.

At this point, it should be understood that the use of such terms as “top”, “bottom” and the like herein and in the claims hereof is for providing a more clear and concise description of the invention. The connector assembly can be used in omni-directional applications. In fact, connector assembly 10 is shown in FIGS. 1–3 in what could be considered an upside-down orientation. In other words, the connector assembly is adapted for mounting on a second printed circuit board (not shown) which is positioned onto the top of the assembly as shown in FIGS. 1–3, whereas in actual practice the connector assembly most likely would be positioned down onto the circuit board.

With those understandings, terminal modules 12 and 12A are mounted on a connector housing, generally designated 20, which includes a pair of mounting posts 22 for insertion into appropriate mounting holes in the second circuit board. The housing has a bottom face 23 from which the mounting posts project. A pair of hold-down members 24 are mounted in cavities within housing 20 and include mounting legs 24*a* for insertion into appropriate mounting holes in the second printed circuit board. Connector housing 20 may be molded of dielectric plastic material, and hold-down members 24 may be fabricated of metal material. A cover 26 is mounted onto connector housing 20 by means of a pair of latch arms 26*a* (FIG. 3).

Figure 5:
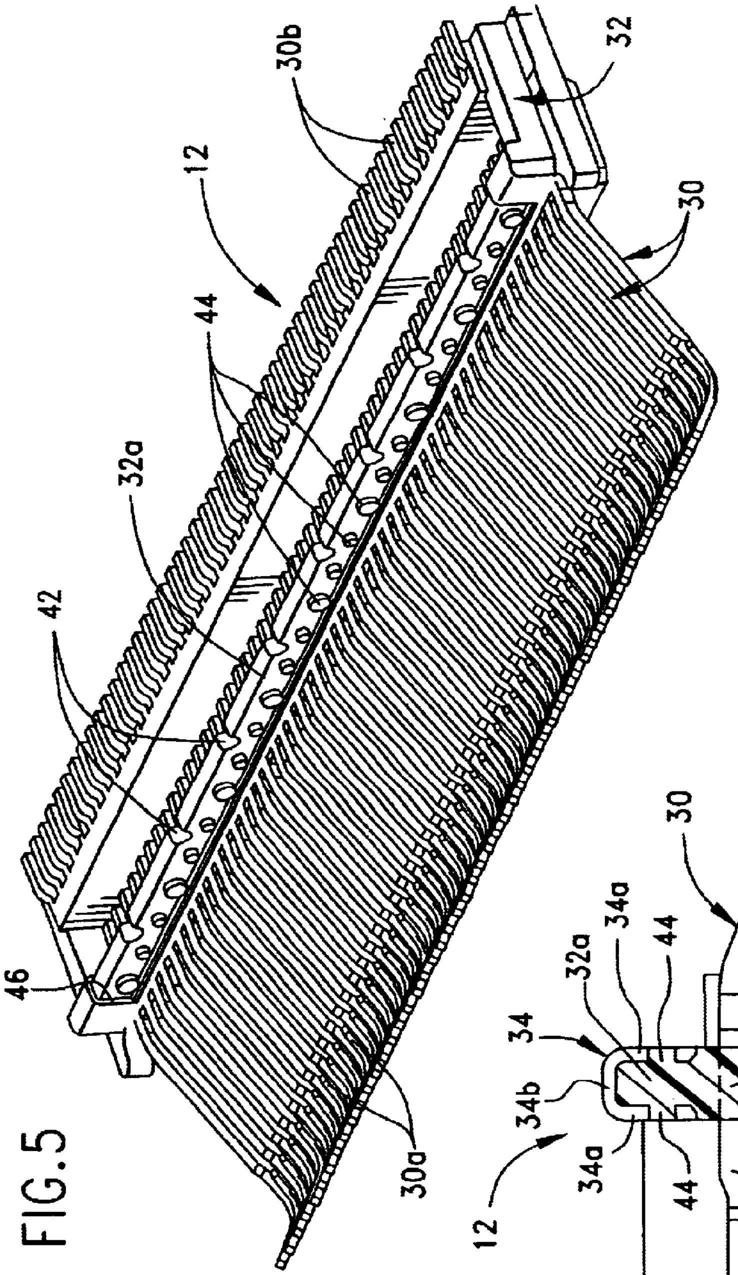
FIG. 5 is a perspective of the terminal module, with the elongated solder bar removed to show the details of the fixing rib of the housing.
Figure 4:
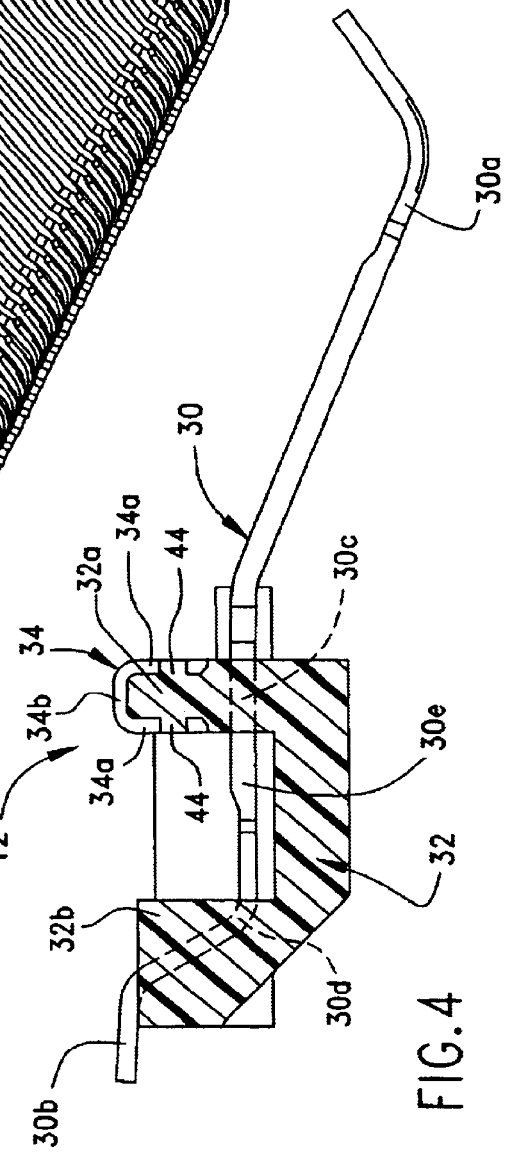
FIG. 4 is an enlarged vertical section through the terminal module which incorporates the elongated solder bar.

FIGS. 4 and 5 show terminal module 12 in greater detail, particularly in conjunction with FIG. 2. The terminal module includes a plurality of elongated conductive terminals, generally designated 30, which are arranged in a generally parallel side-by-side array as is clearly shown in FIG. 5. The terminals may be stamped and formed of conductive sheet metal material. Each elongated terminal 30 includes a pair of opposite end sections 30*a* and 30*b* which form contacts or tail portions of the terminal at opposite ends thereof. End sections or tail portions 30*a* of the terminals are provided for engaging contacts 16 (FIG. 3) of circuit board 14 as seen in FIG. 2. End sections or tail portions 30*b* of the terminals are provided for engaging contacts on the second circuit board (not shown) to which connector assembly 10 is mounted. Each terminal also includes a pair of holding sections 30*c* and 30*d* (FIG. 4) located immediately adjacent to and inside end section 30*a* and 30*b*. A central section 30*e* is located between holding sections 30*c* and 30*d*.

Still referring to FIGS. 4 and 5 particularly in conjunction with FIG. 2, terminal module 12 includes a dielectric, molded plastic housing, generally designated 32, which is overmolded about holding sections 30*c* and 30*d* of terminals 30, leaving opposite ends sections or tail portions 30*a* and 30*b* exposed as is seen clearly in FIG. 5. In essence, overmolded housing 32 includes a pair of ribs 32*a* and 32*b* which are overmolded about holding sections 30*c* and 30*d*, respectively, of the terminals.

The invention herein is incorporated in an elongated solder bar, generally designated 34 (FIG. 4) which embraces rib 32*a* of terminal module housing 32. Therefore, rib 32*a* can be considered an elongated fixing rib.

Figure 6:
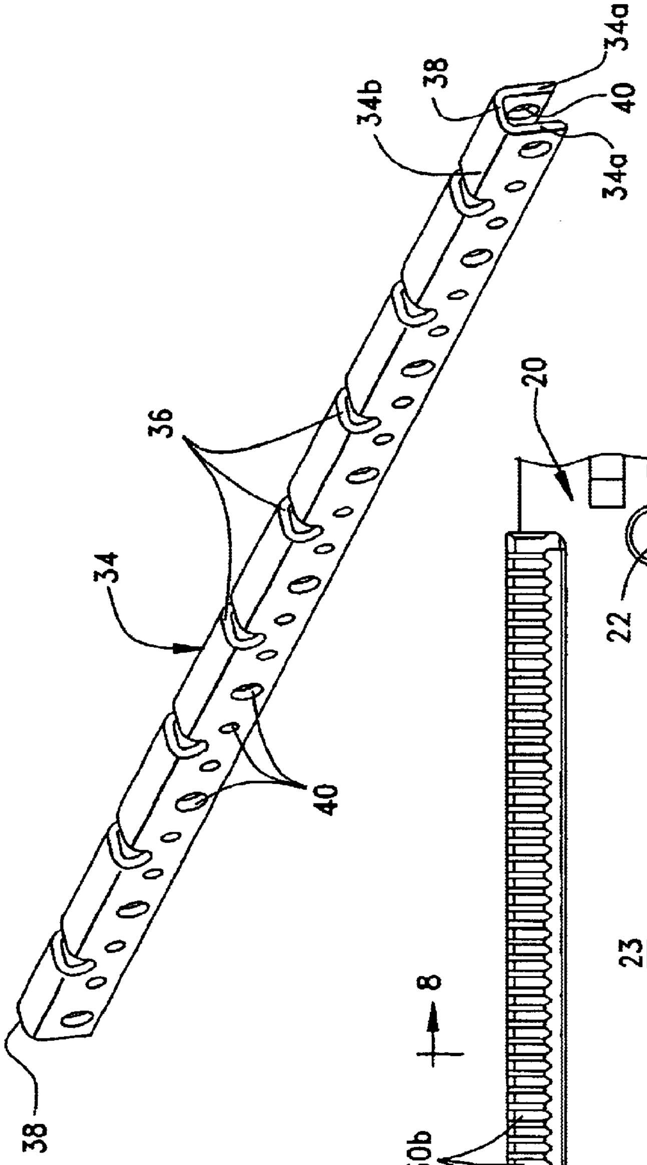
FIG. 6 is an enlarged perspective view of the elongated solder bar.

Referring to FIG. 6, elongated solder bar 34 is shown in greater detail, the elongated solder bar is generally U-shaped in cross-section for embracing fixing rib 32*a* as seen in FIG. 4. The U-shaped solder bar defines a pair of side wall portions 34*a* joined by a base wall portion 34*b*. A plurality of air vent openings 36 are spaced between opposite ends 38 of the solder bar to facilitate air flow during a soldering process. As seen clearly in FIG. 6, air vent openings 36 are formed in base wall portion 34*b* and extend into side wall portions 34*a* of the U-shaped solder bar. Side wall portions 34*a* have a plurality of holes 40 spaced along the length of the bar and into which molded material of plastic housing 32 projects, as described below.

Referring back to FIG. 5, fixing rib 32*a* of molded plastic housing 32 of terminal module 12 is shown in greater detail. Specifically, the top edge of the fixing rib is molded with a plurality of cut-out areas 42 which are located beneath or behind solder bar 34 in registry with air vent openings 36 in the solder bar. These cut-out areas assist in air flow through vent openings 36 during a soldering process. FIG. 5 also shows a plurality of bosses 44 which project outwardly from opposite sides of fixing rib 32*a*. These bosses represent the molded plastic material which projects into holes 40 (FIG. 6) in the side wall portions of solder bar 34 to securely hold the solder bar embracing fixing rib 32*a* as seen in FIG. 4. It should be understood that, in actual practice, fixing rib 32*a* would not be in the configuration shown in FIG. 5 without the presence of elongated solder bar 34. In other words, housing 32 is overmolded over portions of the solder bar, and the molten plastic material which forms bosses 44 would not be formed until the material actually flows into holes 40 of the solder bar in an appropriate molding dic during the overmolding procedure.

FIG. 5 also shows a recessed area 46 running the length of fixing rib 32*a* and in which solder bar 34 (not shown) is disposed. This will allow the bottom or base wall 34*b* of the solder bar be at the same level as the tail portion 30*b* of the terminal.

Terminal module 12A is substantially identical to terminal module 12, except for the shape of end sections or tail portions 30*a* of the terminals, along with the fact that terminal module 12A does not have an elongated solder bar 34. Tail portions 30*a* of the terminals of terminal module 12A are configured for engaging contacts 18 (FIG. 3) of circuit board 14. Tail portions 30*b* of the terminals of terminal module 12A are adapted for engaging appropriate contact pads on the second printed circuit board to which connector 10 is mounted, just as are tail portions 30*b* of the terminals of terminal module 12.

Figure 7:
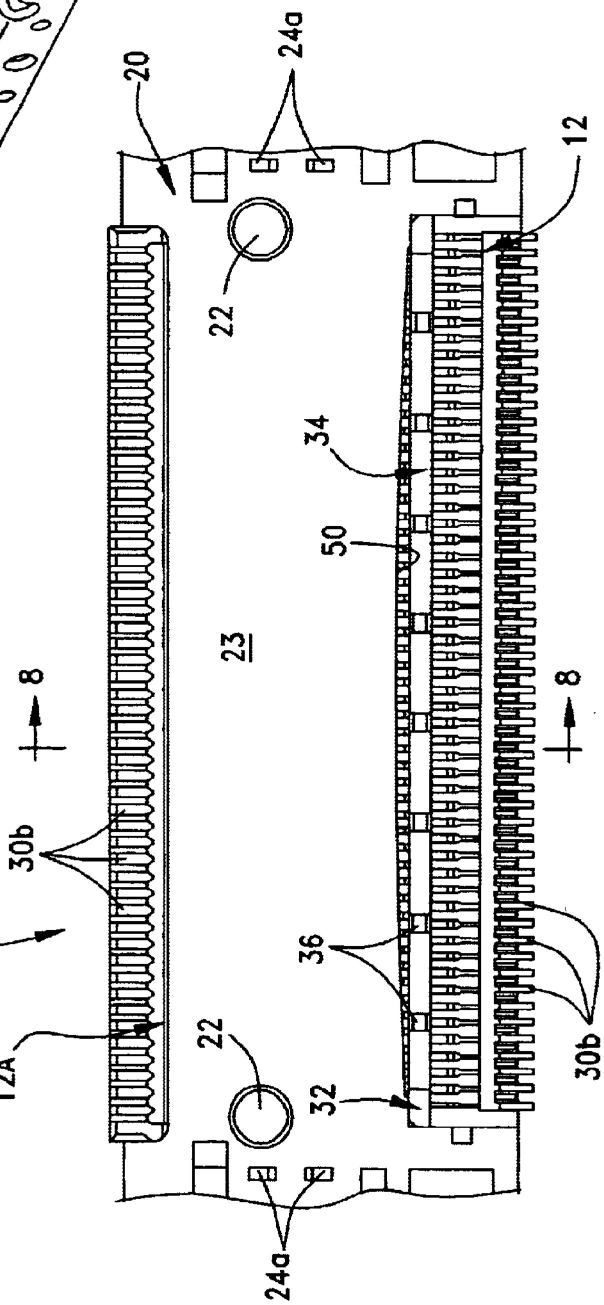
FIG. 7 is a plan view showing the configuration of the air vent channel extending along the elongated solder bar.
Figure 8:
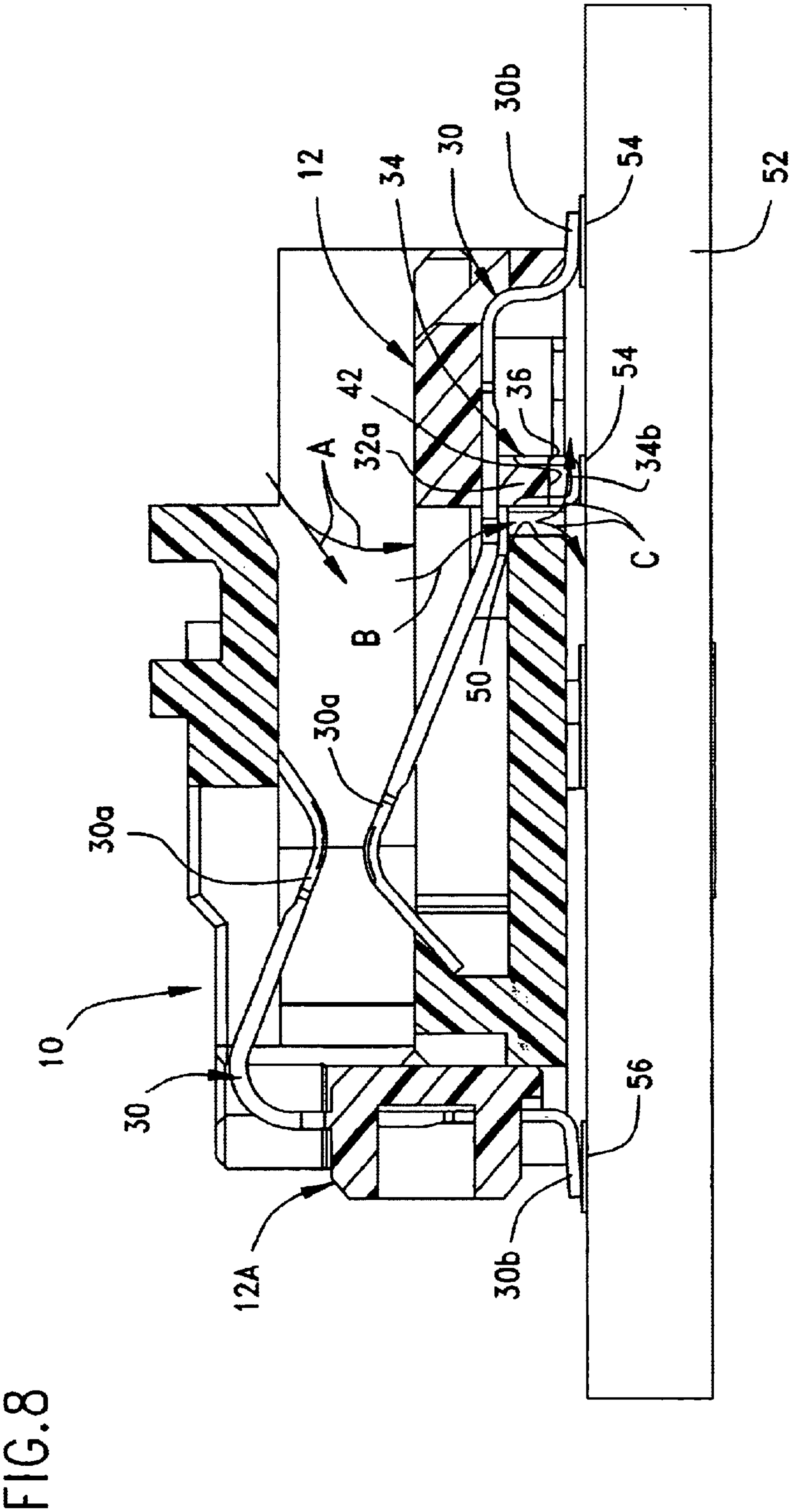
FIG. 8 is a vertical section taken generally along line 8—8 of FIG. 7.

FIGS. 7 and 8 show another feature of the invention. Specifically, an elongated air vent channel 50 is formed in molded plastic housing 20 of connector 10 adjacent to and extending along substantially the length of elongated solder bar 34 of terminal module 12. This air vent channel facilitates the flow of air around the solder bar to help distribute heat during the soldering process. It can be seen in FIG. 7 air vent channel 50 is wider at the center thereof than at opposite ends thereof. This will more evenly distribute the air across the width of the housing between ends of the solder bar.

FIG. 8 shows the entire connector 10 mounted to the second printed circuit board 52. Base wall portion 34*b* of solder bar 34 is shown soldered to an elongated soldering pad 54 on the circuit board. Air vent openings 36 in the solder bar, cut-out areas 42 in fixing rib 32*a* of the terminal module housing, and air vent channel 50 in the connector housing all are shown in this depiction. Arrows “A” show how air is forced into the connector toward the vicinity of the solder bar. Arrow “B” shows how the air is drawn downwardly into and through air vent channel 50. Arrows “C” show that the air is drawn downwardly around the area at which base wall portion 34*b* of solder bar 34 is soldered to solder pad 54 of the circuit board, including the flow of air through air vent openings 36 in the solder bar and cut-out areas 42 in fixing rib 32*a*. Finally, FIG. 8 shows tail sections 30*b* of terminals 30 of terminal module 12 soldered to circuit traces 54 on circuit board 52, as well as tail sections 30*b* of terminals 30 of terminal module 10A soldered to appropriate circuit traces 56 on the circuit board.

It should be understood that the inventive concepts embodied in the elongated solder bar 34 herein can be used in a wide variety of connector assemblies or configurations. Connector assembly 10 is but one assembly with which the solder bar can be used. In connector assembly 10, the solder bar actually is used in one of the terminal modules, particularly terminal module 12. However, it is contemplated that such an elongated solder bar can be used directly on the connector housing itself as well as on the housings of a wide variety of connector configurations. With the solder bar being elongated and extending substantially between opposite sides of the connector housing, the solder bar supports the middle of the housing and prevents it from bowing during the soldering process. The elongated soldering bar is a vast improvement over individual fasteners or solderable fitting nails of the prior art.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A board mounted electrical connector, comprising:

a dielectric housing for mounting on a printed circuit board; and an elongated solder bar of solderable material secured at a bottom face of the housing for mechanically fixing the housing to appropriate solder pad on the board, the elongated solder bar having opposite ends and air vent openings spaced between the opposite ends to facilitate air flow during a soldering process.

2. The board mounted electrical connector of claim 1 wherein said housing includes cut-out areas behind the solder bar in registry with the air vent openings in the solder bar to assist said air flow at the vent openings.

3. The board mounted electrical connector of claim 1 wherein said housing has an elongated rib, and said elongated solder bar is generally U-shaped in cross-section and embraces the rib.

4. The board mounted electrical connector of claim 3 wherein said U-shaped solder bar defines a pair of side wall portions joined by a base wall portion, with said air vent openings being located at least in the base wall portion.

5. The board mounted electrical connector of claim 4 wherein said air vent openings extend into the side wall portions of the U-shaped solder bar.

6. The board mounted electrical connector of claim 5 wherein said rib has cut-out areas in registry with said vent openings to assist in air flow therethrough.

7. The board mounted electrical connector of claim 1 wherein said dielectric housing is molded of plastic material and is overmolded over portions of the solder bar to secure the bar to the housing.

8. The board mounted electrical connector of claim 7 wherein said solder bar includes a plurality of holes into which the molded material of the housing projects.

9. The board mounted electrical connector of claim 1 wherein the connector is part of a connector assembly which includes an assembly housing, and including an elongated air vent channel adjacent to and extending along substantially the length of the elongated solder bar between the solder bar and the assembly housing.

10. The board mounted electrical connector of claim 9 wherein said elongated air vent channel is wider at a central area thereof than at opposite end areas thereof.

11. The board mounted electrical connector of claim 1 wherein said dielectric housing has opposite sides and is elongated therebetween, and said elongated solder bar extends substantially between the opposite sides of the housing.

12. A board mounted electrical connector, comprising:

a dielectric housing molded of plastic material for mounting on a printed circuit board, the housing having an elongated fixing rib; and an elongated solder bar of solderable material overmolded by portions of the housing to secure the solder bar at a bottom face of the housing for mechanically fixing the housing to appropriate solder pad on the board, the elongated solder bar having opposite ends and being generally U-shaped in cross-section for embracing the fixing rib of the housing, the solder bar having air vent openings spaced between the opposite ends thereof to facilitate air flow during a soldering process.

13. The board mounted electrical connector of claim 12 wherein said U-shaped solder bar defines a pair of side wall portions joined by a base wall portion, with said air vent openings being located at least in the base wall portion.

14. The board mounted electrical connector of claim 13 wherein said air vent openings extend into the side wall portions of the U-shaped solder bar.

15. The board mounted electrical connector of claim 14 wherein said rib has cut-out areas in registry with said vent openings to assist in air flow therethrough.

16. The board mounted electrical connector of claim 12 wherein said solder bar includes a plurality of holes into which the molded material of the housing projects.

17. The board mounted electrical connector of claim 12 wherein the connector is part of a connector assembly which includes an assembly housing, and including an elongated air vent channel adjacent to and extending along substantially the length of the elongated solder bar between the solder bar and the assembly housing.

18. The board mounted electrical connector of claim 17 wherein said elongated air vent channel is wider at a central area thereof than at opposite end areas thereof.

19. The board mounted electrical connector of claim 12 wherein said dielectric housing has opposite sides and is elongated therebetween, and said elongated solder bar extends substantially between the opposite sides of the housing.

20. A terminal module for use in an electrical connector, comprising:

a plurality of conductive terminals arranged in a generally parallel side-by-side array, the terminals having tail sections for soldering to appropriate circuit traces on a printed circuit board;

a dielectric plastic housing overmolded about portions of the terminals leaving at least said tail portions exposed; and an elongated solder bar of solderable material secured to the housing for mechanically fixing the housing to appropriate solder pad on the circuit board, the elongated solder bar having opposite ends and air vent openings spaced between the opposite ends to facilitate air flow during a soldering process.

21. The board mounted electrical connector of claim 20 wherein said housing includes cut-out areas behind the solder bar in registry with the air vent openings in the solder bar to assist said air flow at the vent openings.

22. The board mounted electrical connector of claim 20 wherein said housing has an elongated rib, and said elongated solder bar is generally U-shaped in cross-section and embraces the rib.

23. The board mounted electrical connector of claim 22 wherein said U-shaped solder bar defines a pair of side wall portions joined by a base wall portion, with said air vent openings being located at least in the base wall portion.

24. The board mounted electrical connector of claim 23 wherein said air vent openings extend into the side wall portions of the U-shaped solder bar.

25. The board mounted electrical connector of claim 24 wherein said rib has cutout areas in registry with said vent openings to assist in air flow therethrough.

26. The board mounted electrical connector of claim 20 wherein said solder bar includes a plurality of holes into which the molded material of the housing projects.

27. The board mounted electrical connector of claim 20 wherein said dielectric housing has opposite sides and is elongated therebetween, and said elongated solder bar extends substantially between the opposite sides of the housing.

28. The board mounted electrical connector of claim 20 wherein said electrical connector includes a connector housing, and including an elongated air vent channel adjacent to and extending along substantially the length of the elongated solder bar between the solder bar and the connector housing.

29. The board mounted electrical connector of claim 28 wherein said elongated air vent channel is wider at a central area thereof than at opposite end areas thereof.

* * * * *